(12) United States Patent
Aziz et al.

(10) Patent No.: US 7,750,561 B2
(45) Date of Patent: Jul. 6, 2010

(54) STACKED OLED STRUCTURE

(75) Inventors: Hany Aziz, Oakville (CA); Jennifer A. Coggan, Cambridge (CA)

(73) Assignee: LG Display Co., Ltd., Seoul (KR)

( * ) Notice: Subject to any disclaimer, the term of this patent is extended or adjusted under 35 U.S.C. 154(b) by 686 days.

(21) Appl. No.: 11/133,975

(22) Filed: May 20, 2005

(65) Prior Publication Data

US 2006/0261731 A1    Nov. 23, 2006

(51) Int. Cl.
*H05B 33/00* (2006.01)
*H01L 51/52* (2006.01)

(52) U.S. Cl. .................. 313/506; 313/504; 428/690

(58) Field of Classification Search .................. 313/504; 428/690

See application file for complete search history.

(56) References Cited

U.S. PATENT DOCUMENTS

| | | |
|---|---|---|
| 2,823,905 A | 2/1958 | Brown |
| 3,172,862 A | 3/1965 | Gurnee et al. |
| 3,598,644 A | 8/1971 | Goffe et al. |
| 4,084,966 A | 4/1978 | Haas et al. |
| 4,287,449 A | 9/1981 | Takeda et al. |
| 4,356,429 A | 10/1982 | Tang |
| 4,539,507 A | 9/1985 | VanSlyke et al. |
| 4,652,794 A | 3/1987 | Waite et al. |
| 4,665,115 A | 5/1987 | Lundberg et al. |
| 4,720,432 A | 1/1988 | Vanslyke et al. |
| 4,769,292 A | 9/1988 | Tang et al. |
| 4,885,211 A | 12/1989 | Tang et al. |
| 5,049,780 A | 9/1991 | Dobrowolski et al. |
| 5,059,861 A | 10/1991 | Littman et al. |
| 5,141,671 A | 8/1992 | Bryan et al. |
| 5,150,006 A | 9/1992 | Van Slyke et al. |
| 5,151,629 A | 9/1992 | VanSlyke |
| 5,227,252 A | 7/1993 | Murayama et al. |
| 5,247,190 A | 9/1993 | Friend et al. |
| 5,276,381 A | 1/1994 | Wakimoto et al. |
| 5,409,783 A | 4/1995 | Tang et al. |
| 5,429,884 A | 7/1995 | Namiki et al. |
| 5,457,565 A | 10/1995 | Namiki et al. |
| 5,516,577 A | 5/1996 | Matsuura et al. |
| 5,593,788 A | 1/1997 | Shi et al. |
| 5,601,903 A | 2/1997 | Fujii et al. |

(Continued)

FOREIGN PATENT DOCUMENTS

EP    0 977 287    2/2000

(Continued)

OTHER PUBLICATIONS

Matsumoto, Toshio, et al., Multiphoton Emission OLED: Structure and Property, IDW'03, Dec. 2003, pp. 1285-1288.*

(Continued)

*Primary Examiner*—Sikha Roy
(74) *Attorney, Agent, or Firm*—McKenna Long & Aldridge LLP

(57) ABSTRACT

A stacked OLED device comprises a plurality of individual OLEDs in a vertical stacked arrangement separated by intermediate electrodes, wherein at least one of the individual OLEDs includes a light emitting region or zone comprising a mixed region; the mixed region comprising a mixture of a hole transport material, an electron transport material, and optionally a dopant.

28 Claims, 5 Drawing Sheets

U.S. PATENT DOCUMENTS

| | | | |
|---|---|---|---|
| 5,608,287 A | 3/1997 | Hung et al. | |
| 5,703,436 A | 12/1997 | Forrest et al. | |
| 5,707,745 A | 1/1998 | Forrest et al. | |
| 5,719,467 A | 2/1998 | Antoniadis et al. | |
| 5,728,801 A | 3/1998 | Wu et al. | |
| 5,739,635 A | 4/1998 | Wakimoto | |
| 5,776,622 A | 7/1998 | Hung et al. | |
| 5,837,391 A * | 11/1998 | Utsugi | 428/690 |
| 5,846,666 A | 12/1998 | Hu et al. | |
| 5,853,905 A | 12/1998 | So et al. | |
| 5,925,472 A | 7/1999 | Hu et al. | |
| 5,925,980 A | 7/1999 | So et al. | |
| 5,935,720 A | 8/1999 | Chen et al. | |
| 5,935,721 A | 8/1999 | Shi et al. | |
| 5,942,340 A | 8/1999 | Hu et al. | |
| 5,952,115 A | 9/1999 | Hu et al. | |
| 5,955,836 A | 9/1999 | Boerner et al. | |
| 5,972,247 A | 10/1999 | Shi et al. | |
| 6,013,384 A | 1/2000 | Kido et al. | |
| 6,023,073 A | 2/2000 | Strite | |
| 6,028,327 A | 2/2000 | Mizoguchi et al. | |
| 6,057,048 A | 5/2000 | Hu et al. | |
| 6,105,202 A | 8/2000 | Grasso et al. | |
| 6,107,734 A * | 8/2000 | Tanaka et al. | 313/506 |
| 6,130,001 A | 10/2000 | Shi et al. | |
| 6,225,467 B1 | 5/2001 | Esteghamatian et al. | |
| 6,229,012 B1 | 5/2001 | Hu et al. | |
| 6,274,980 B1 * | 8/2001 | Burrows et al. | 313/506 |
| 6,303,250 B1 | 10/2001 | Watanabe et al. | |
| 6,392,250 B1 * | 5/2002 | Aziz et al. | 257/40 |
| 6,392,339 B1 | 5/2002 | Aziz et al. | |
| 6,423,429 B2 | 7/2002 | Kido et al. | |
| 6,437,123 B1 | 8/2002 | Bock | |
| 6,465,115 B2 | 10/2002 | Shi et al. | |
| 6,479,172 B2 | 11/2002 | Hu et al. | |
| 6,562,485 B2 | 5/2003 | Hu et al. | |
| 6,565,996 B2 | 5/2003 | Hatwar et al. | |
| 6,614,175 B2 | 9/2003 | Aziz et al. | |
| 6,717,358 B1 * | 4/2004 | Liao et al. | 313/504 |
| 6,734,625 B2 | 5/2004 | Vong et al. | |
| 6,737,177 B2 | 5/2004 | Aziz et al. | |
| 6,740,429 B2 | 5/2004 | Aziz et al. | |
| 6,750,609 B2 | 6/2004 | Aziz et al. | |
| 6,753,098 B2 | 6/2004 | Aziz et al. | |
| 6,759,146 B2 | 7/2004 | Aziz et al. | |
| 6,765,348 B2 | 7/2004 | Aziz et al. | |
| 6,773,830 B2 | 8/2004 | Aziz et al. | |
| 6,821,643 B1 | 11/2004 | Hu et al. | |
| 6,841,932 B2 | 1/2005 | Aziz et al. | |
| 7,083,490 B2 | 8/2006 | Mueller et al. | |
| 7,211,948 B2 | 5/2007 | Liao et al | |
| 7,288,887 B2 | 10/2007 | Aziz et al. | |
| 7,291,404 B2 | 11/2007 | Aziz et al. | |
| 7,351,999 B2 * | 4/2008 | Li | 257/40 |
| 2002/0121860 A1 | 9/2002 | Seo et al. | |
| 2002/0135296 A1 | 9/2002 | Aziz et al. | |
| 2002/0145380 A1 | 10/2002 | Aziz et al. | |
| 2002/0180349 A1 * | 12/2002 | Aziz et al. | 313/506 |
| 2003/0071565 A1 * | 4/2003 | Hatwar et al. | 313/504 |
| 2003/0116772 A1 | 6/2003 | Yamazaki et al. | |
| 2003/0134146 A1 | 7/2003 | Aziz et al. | |
| 2003/0189401 A1 * | 10/2003 | Kido et al. | 313/504 |
| 2003/0230974 A1 | 12/2003 | Chang et al. | |
| 2003/0234609 A1 | 12/2003 | Aziz et al. | |
| 2004/0004433 A1 | 1/2004 | Lamansky et al. | |
| 2004/0009418 A1 | 1/2004 | Main et al. | |
| 2004/0018383 A1 | 1/2004 | Aziz et al. | |
| 2004/0027059 A1 * | 2/2004 | Tsutsui | 313/504 |
| 2004/0227460 A1 | 11/2004 | Liao et al. | |
| 2004/0262615 A1 | 12/2004 | Cok | |
| 2005/0011240 A1 | 1/2005 | Huang et al. | |
| 2005/0064235 A1 | 3/2005 | Liao et al. | |
| 2005/0100760 A1 | 5/2005 | Yokoyama | |
| 2005/0112400 A1 * | 5/2005 | Seo et al. | 428/690 |
| 2005/0140275 A1 * | 6/2005 | Park | 313/504 |
| 2005/0175857 A1 | 8/2005 | Coggan et al. | |
| 2006/0105202 A1 | 5/2006 | Kitamura | |
| 2006/0139516 A1 | 6/2006 | Park | |
| 2006/0139893 A1 | 6/2006 | Yoshimura et al. | |
| 2006/0194076 A1 | 8/2006 | Nariyuki | |
| 2006/0251919 A1 | 11/2006 | Aziz et al. | |
| 2006/0251920 A1 | 11/2006 | Aziz et al. | |
| 2006/0261727 A1 | 11/2006 | Aziz et al. | |
| 2006/0261731 A1 | 11/2006 | Aziz et al. | |
| 2006/0263593 A1 | 11/2006 | Aziz et al. | |
| 2006/0263628 A1 | 11/2006 | Aziz et al. | |
| 2006/0263629 A1 | 11/2006 | Aziz et al. | |
| 2006/0265278 A1 | 11/2006 | Dimeo | |

FOREIGN PATENT DOCUMENTS

| | | |
|---|---|---|
| EP | 0 977 288 | 2/2000 |
| EP | 1 009 044 | 6/2000 |
| EP | 1 010 359 | 6/2000 |
| EP | 1 017 118 | 7/2000 |
| EP | 1 029 832 | 8/2000 |
| EP | 1 160 890 | 12/2001 |
| EP | 1 167 488 | 1/2002 |
| EP | 1 311 139 | 5/2003 |
| EP | 1339112 A | 8/2003 |
| EP | 1 408 563 | 4/2004 |
| EP | 1 624 503 | 2/2006 |
| EP | 1 624 504 | 2/2006 |
| JP | 04-230997 | 8/1992 |
| JP | 06-176870 | 6/1994 |
| JP | 8-222374 | 8/1996 |
| JP | 09-188875 | 7/1997 |
| JP | 10-316904 | 12/1998 |
| JP | 11-312584 | 11/1999 |
| JP | 11-329749 | 11/1999 |
| JP | 2002-055203 | 2/2002 |
| JP | 2003-045676 | 2/2003 |
| JP | 2003-086381 | 3/2003 |
| JP | 2003-151777 | 5/2003 |
| JP | 2004-039617 | 2/2004 |
| JP | 2004-095546 | 3/2004 |
| JP | 2004-139981 | 5/2004 |
| JP | 2004-317897 | 11/2004 |
| JP | 2005-070574 | 3/2005 |
| JP | 2005-072012 | 3/2005 |
| JP | 2006-173550 | 6/2006 |
| JP | 2006-210845 | 8/2006 |
| WO | WO 97/33296 | 9/1997 |
| WO | WO 98/41065 | 9/1998 |
| WO | WO 00/30139 | 5/2000 |
| WO | WO 01/06816 | 1/2001 |
| WO | WO 01/08240 | 2/2001 |
| WO | WO 03/055275 | 7/2003 |
| WO | WO/03/088718 | 10/2003 |
| WO | WO/2004/068911 | 8/2004 |
| WO | WO 2005/037954 | 4/2005 |
| WO | WO 2006/033472 | 3/2006 |
| WO | WO 2006/038573 | 4/2006 |
| WO | WO 2006/072092 | 7/2006 |

OTHER PUBLICATIONS

Choong et al, Organic light-emitting diodes with a bipolar transport layer, Applied Physics Letters, vol. 75, No. 2, Jul. 12, 1999, p[s. 172-174.*

Welying Gao; Controlled p doping of the hole-transport molecular material N,N'=diphenyl-N,N'-bis(1-naphthyl)-1,1'-biphenyl-4,4'-diamine with Terafluorotetracyanoquinodimethane, Journal of Applied Physics, vol. 94, No. 1 (Jul. 1, 2003), pp. 359-366.

H. Michelle Grandia et al.; Light-Absorption Phenomena in Novel Low-Reflective Cathodes for Organic Light-Emitting Devices Utilizing Metal-Organic Mixtures; Advanced Materials, 2003, 15, No. 23; pp. 3021-3024.

Aziz et al., "Reduced reflectance cathode for organic light-emitting devices using metal organic mixtures", Applied Physics Letters, vol. 83, No. 1, pp. 186-188 (2003).

Day et al., "The use of charge transfer interlayers to control hole injection in molecular organic light emitting diodes", Thin Solid Films, vol. 410, pp. 159-166 (Mar. 2002).

A. Gyoutoku et al., "An Organic Electroluminescent Dot-Matrix Display Using Carbon Underlayer", Synthetic Metals, vol. 91, pp. 73-75 (1997).

Baldo et al., "Highly efficient phosphorescent emission from organic electroluminescent devices," Letters to Nature, vol. 395, pp. 151-154 (1998).

Bernius et al., "Developmental Progress of Electroluminescent Polymeric Materials and Devices" Proceedings of SPIE Conference on Organic Light Emitting Materials and Devices III, Denver, Colo., vol. 3797, p. 129-137 (Jul. 1999).

Carter et al., "Polymeric anodes for improved polymer light-emitting diode performance", Appl. Phys. Lett. 70 (16), pp. 2067-2069 (Apr. 21, 1997).

Chengfeng Qiu et al., Comparative Study of Metal or Oxide Capped Indium-Tin Oxide Anodes for Organic Light-Emitting Diodes, Journal of Applied Physics, vol. 93, No. 6 pp. 3253-3257 (Mar. 15, 2003).

Chengfeng Qiu et al., "Praseodymium Oxide Coated Anode for Organic Light-Emitting Diode", Applied Physics Letters, vol. 80, No. 19, pp. 3485-3487 (May 13, 2002).

Chieh-Wei Chen et al., "Top-Emitting Organic Light-Emitting Devices Using Surface-Modified Ag Anode," Applied Physics Letters, vol. 83, No. 25, pp. 5127-5129 (Dec. 22, 2003).

Endo et al., "Organic Electroluminescent Devices with a Vacuum-Deposited Lewis-Acid-Doped Hole-Injecting Layer", Japanese Journal of Applied Physics, vol. 41, pp. L358-L360 (Mar. 2002).

Hongjin Jiang et al., "Improvement of Organic Light-Emitting Diodes Performance by the Insertion of a $Si_3N_4$ Layer", Thin Solid Films, vol. 363, pp. 25-29 (2000).

Hyun-Ouk Ha et al., "Improving the efficiency of organic electroluminescent devices by introducing an electron-accepting and thermally stable polymer", Optical Materials, vol. 21 pp. 165-168 (2002).

I-Min Chan et al., "Enhanced Hole Injections in Organic Light-Emitting Devices by Depositing Nickel Oxide on Indium Tin Oxide Anode," Applied Physics Letters, vol. 81, No. 10, pp. 1899-1901 (Sep. 2, 2002).

Kido et al., "White-Light-Emitting Organic Electroluminescent Device Using Lanthanide Complexes," Jpn. J. Appl. Phys., vol. 35, pp. L394-L396 (1996).

Kim et al., "Molecular organic light-emitting diodes using highly conducting polymers as anodes", Appl. Phys. Lett., vol. 80 No. 20, pp. 3844-3846 (May 20, 2002).

L.S. Hung et al., "Anode Modification of in Organic Light-Emitting Diodes by Low-Frequency Plasma Polymerization of CHF3", Applied Physics Letters, vol. 78, No. 5, pp. 673-675 (Jan. 29, 2001).

Liu et al., "Development of highly stable organic electroluminescent devices with a doped co-host emitter system", Current Applied Physics 5, pp. 218-221 (2005).

S. A. VanSlyke et al., "Organic Electroluminescent Devices with Improved Stability", Applied Physics Letters, vol. 69, No. 15, pp. 2160-2162 (Oct. 7, 1996).

S. Karg et al., "Increased Brightness and Lifetime of Polymer Light Emitting Diodes with Polyanilne Anodes", Synthetic Metals, vol. 80, pp. 111-117 (1996).

Soo-Jin Chua et al., "Stabilization of Electrode Migration in Polymer Electroluminescent Devices", Applied Physics Letters, vol. 81, No. 6, pp. 1119-1121 (Aug. 5, 2002).

Wenping Hu et al., "Lowering of Operational Voltage of Organic Electroluminescent Devices by Coating Indium Tin Oxide Electrodes with a Thin $CuO_x$ Layer", Applied Physics Letters, vol. 80, No. 15, pp. 2640-2641 (Apr. 15, 2002).

Yulong Shen et al., "Modification of Indium Tin Oxide for Improved Hole Injection in Organic Light Emitting Diodes," Advanced Materials, vol. 13, No. 16 pp. 1234-1238 (Aug. 16, 2001).

Z.B. Deng et al., "Enhanced Brightness and Efficiency in Organic Electroluminescent Devices Using $SiO_2$ Buffer Layers", Applied Physics Letters, vol. 74, No. 15, pp. 2227-2229 (Apr. 12, 1999).

Zugang et al., "Organic thin film electroluminescent devices with ZnO:Al as the anode", J. Phys.: Condens. Matter 8, pp. 3221-3228 (1996).

Blochwitz et al., "Non-polymeric OLEDs with a doped amorphous hole transport layer and operating voltages down to 3.2 V to achieve 100 $cd/m^2$", Synth. Metals 2002, vol. 127, pp. 169-173.

Choong et al., Organic light-emitting diodes with a bipolar transport lay r , Applied Physics Letters, vol. 75, No. 2, 1999, pp. 172-174.

Endo et al., "Organic Electroluminescent Devices with a Vacuum-Deposited Lewis-Acid-Doped Hole-Injecting Layer", Japanese Journal of Applied Physics, vol. 41, No. 3B, 2002, pp. L358-L360.

Kim et al., "Anode material based on Zr-doped ZnO thin films for organic light-emitting diodes", Appl. Phys. Lett., vol. 83, No. 18, 2003, pp. 3809-3811.

* cited by examiner

△: Example 1

O: Comparative Example I

STACKED OLED STRUCTURE

BACKGROUND

The present disclosure relates, in various exemplary embodiments, to organic light emitting devices (OLEDs). In particular, the present disclosure relates to stacked OLED configurations.

Organic light emitting devices (OLEDs) represent a promising technology for display applications. A typical organic light emitting device includes a first electrode; a luminescent region comprising one or more electroluminescent organic material(s); and a second electrode; wherein one of the first electrode and the second electrode functions as a hole injecting anode, and the other electrode functions as an electron injecting cathode; and wherein one of the first electrode and the second electrode is a front electrode, and the other electrode is a back electrode. The front electrode is transparent (or at least partially transparent) while the back electrode is usually highly reflective to light. When a voltage is applied across the first and second electrodes, light is emitted from the luminescent region and through the transparent front electrode.

It is sometimes desirable to laminate two or more individual OLEDs in a stacked configuration to form a stacked OLED. Stacked OLED configurations include intermediate electrodes disposed between adjacent individual OLEDs. That is, successive OLEDs share an intermediate electrode, and a top electrode of one individual OLED in the stack also functions as a bottom electrode of another OLED in the stack. The intermediate electrodes are generally transparent. Further, the intermediate electrodes are often required to act as electron injecting contacts on one side and as hole injecting contacts on the other side.

Stacked OLEDs may emit different colors such that a true color pixel is formed from which any color may be emitted. For example, Burrows et al. disclose in *Appl. Phys. Lett.* 69, 2959 (1996) individual OLEDs with red, green, or blue emissions stacked to form color-tunable vertically integrated pixels.

Stacked, monochromatic OLEDs are also possible such as demonstrated by Matsumoto et al. (*SID* 03 *Digest*, 979 (2003)). Stacked, monochromatic OLEDs potentially provide an OLED configuration having high electroluminescence efficiency.

While the above described stacked OLEDs demonstrate configurations allowing for variable emission colors and monochromatic OLEDs with high electroluminescence efficiency (e.g., greater than 10 cd/A), both suffered from a limited operational stability. Limited operational stability is a known problem for OLEDs in general.

Thus, there is still a need for stacked OLED configurations that exhibit the advantages of existing stacked OLED configurations. There is also a need for stacked OLED configurations that are capable of demonstrating increased operational stability.

BRIEF DESCRIPTION

The present disclosure relates, in various embodiments thereof, to a stacked organic light emitting device comprising a substrate; a first electrode; a second electrode; a plurality of luminescent regions disposed between the first and second electrodes; and an intermediate electrode disposed between successive luminescent regions, wherein at least one of the plurality of luminescent regions comprises a mixed region, the mixed region comprising a mixture of at least two materials having different electron and hole transport capacities, and optionally a dopant; and wherein the mixed region there is at least one electroluminescent material capable of emitting light. The materials having different electron and hole transport capacities can be independently selected from hole transport materials, electron transport materials, and bipolar transport materials.

Additionally, the present disclosure, in embodiments thereof, includes a stacked organic light emitting device comprising a first electrode; a second electrode; a plurality of luminescent regions disposed between the first and second electrodes; and an intermediate electrode disposed between successive luminescent regions, wherein at least one of the plurality of luminescent regions comprises a first charge transport zone, a second charge transport zone, and a mixed region disposed between the first and second charge transport zones, the mixed region comprising a mixture of at least two materials having different electron and hole transport capacities, and optionally a dopant; and wherein the mixed region there is at least one electroluminescent material capable of emitting light. The materials having different electron and hole transport capacities can be independently selected from hole transport materials, electron transport materials, and bipolar transport materials.

Additionally, the present disclosure, in embodiments thereof, includes a stacked organic light emitting device comprising a first electrode; a second electrode; a plurality of luminescent regions disposed between the first and second electrodes; and an intermediate electrode disposed between successive luminescent regions, wherein at least one of the plurality of luminescent regions comprises at least one charge transport zone and a mixed region, the mixed region comprising a mixture of at least two materials having different electron and hole transport capacities, and optionally a dopant; and wherein the mixed region there is at least one electroluminescent material capable of emitting light. The materials having different electron and hole transport capacities can be independently selected from hole transport materials, electron transport materials, and bipolar transport materials.

Further, the present disclosure, in embodiments thereof, relates to an organic light emitting device comprising a substrate; a first electrode; a second electrode; a plurality of luminescent regions disposed between the first and second electrodes; and an intermediate electrode disposed between successive luminescent regions, wherein at least one of the plurality of luminescent regions comprises a first charge transport zone, a second charge transport zone, and a mixed region, the mixed region comprising a mixture of at least two materials having different electron and hole transport capacities, and a dopant; and wherein the mixed region there is at least one electroluminescent material capable of emitting light. The materials having different electron and hole transport capacities can be independently selected from hole transport materials, electron transport materials, and bipolar transport materials.

These and other non-limiting features or characteristics of the disclosure are more particular disclosed below.

BRIEF DESCRIPTION OF THE DRAWINGS

The following is a brief description of the drawings, which are schematic representations presented for the purpose of illustrating exemplary embodiments disclosed herein and not for the purpose of limiting the same.

DETAILED DESCRIPTION

The present disclosure relates to stacked OLED configurations comprising a plurality of individual OLEDs. A stacked OLED includes a first electrode, a second electrode, and a plurality of individual OLEDs disposed between the first and second electrodes. More specifically, a stacked OLED comprises a plurality of luminescent regions disposed between the first and second electrodes, wherein an intermediate electrode is disposed between successive luminescent regions. That is, successive luminescent regions share an intermediate electrode. The combination of a luminescent region disposed between two electrodes is considered to be an individual OLED. Thus, a stacked OLED may be said to comprise a plurality of OLEDs. The individual luminescent regions include a light emitting layer or zone optionally disposed between a first charge transport zone and a second charge transport zone. The light emitting layer of at least one of the individual OLEDs in a stacked OLED includes a mixed region comprising a mixture of at least two materials having different electron and hole transport capacities, and optionally a dopant; and wherein the mixed region there is at least one electroluminescent material capable of emitting light. The materials having different electron and hole transport capacities can be independently selected from hole transport materials, electron transport materials, and bipolar transport materials.

Figure 1:
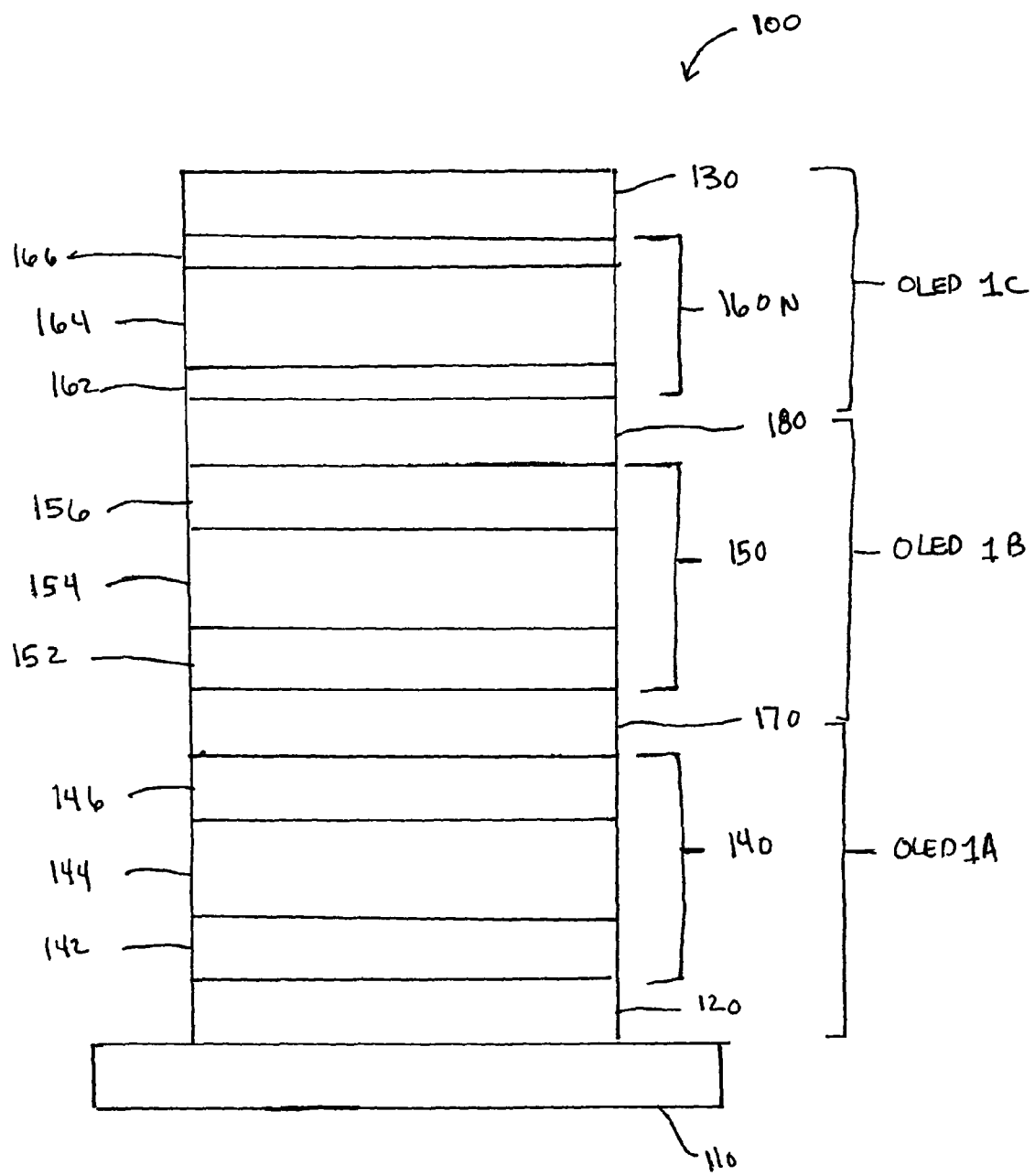
FIG. 1 is a schematic cross sectional view of one embodiment of a stacked OLED in accordance with the present disclosure.

With reference to FIG. 1, stacked OLED 100 includes substrate 110, first electrode 120, second electrode 130, luminescent region 140, luminescent region 150, luminescent region 160N, intermediate electrode 170 disposed between luminescent region 140 and luminescent region 150, and intermediate electrode 180 disposed between luminescent region 150 and luminescent region 160N. With respect to luminescent region 160N, N represents the number of individual luminescent regions 160 present in the stacked OLED 100 and may be 0, 1 or an integer greater than 1. When N is equal to 0, then a stacked OLED comprises two luminescent regions. Where N is greater than 1, it will be appreciated that intermediate electrodes are disposed between any further successive individual OLEDs. Additionally, where N is greater than 1, the luminescent regions 160N may have the same or different configurations and/or compositions as desired for a particular purpose or intended use. For the purpose of simplifying the discussion, N is taken as 1 in the embodiment of FIG. 1 such that stacked OLED 100 comprises luminescent regions 140, 150, and 160.

The stacked OLED 100 comprises a plurality of individual OLEDs, which are formed a luminescent region disposed between two electrodes. For example, stacked OLED 100 comprises three individual OLEDs. OLED 1A is formed from first electrode 120, luminescent region 140, and intermediate electrode 170; OLED 1B is formed from intermediate electrode 170, luminescent region 150, and intermediate electrode 180; and OLED 1C is formed from intermediate electrode 180, luminescent region 160 (N=1), and second electrode 130. As shown in FIG. 1, individual OLEDs may share electrodes. More particularly, successive luminescent regions share at least one intermediate electrode.

Luminescent regions 140, 150, and 160 each include a first transport zone 142, 152, and 162, respectively, a light emitting layer or zone 144, 154, and 164, respectively, and a second charge transport zone 146, 156, and 166, respectively. At least one of the light emitting layers or zones 144, 154, or 164, is a mixed region comprising a mixture of at least two materials having different electron and hole transport capacities, and optionally a dopant; and wherein the mixed region there is at least one electroluminescent material capable of emitting light. The materials having different electron and hole transport capacities can be independently selected from hole transport materials, electron transport materials, and bipolar transport material. In one embodiment, each of the luminescent regions 144, 154, and 164, comprises a mixed region.

While the embodiment in FIG. 1 depicts each of luminescent regions 140, 150, and 160 as having first and second charge transport zones, it will be appreciated that one or more of the charge transport zones may be eliminated depending on the composition of the light emitting layer, intermediate electrodes, and the like. For example, a charge transport zone may be eliminated if the light emitting layer also exhibits a desired charge transporting function (i.e., electron transporting or hole transporting).

The first electrode 120 may be one of a hole injecting anode or an electron injecting cathode. The second electrode 130 may be one of an electron injecting cathode or a hole injecting anode. The first and second electrodes may be an anode or a cathode as desired for a particular purpose or intended use. For example, in OLED 100, whether the second electrode 130 is a cathode or an anode depends upon the charge transport function of the layer or zone immediately underlying the second electrode 130.

The first charge transport zones 142, 152, and 162, and the second charge transport zones, 146, 156, and 166, may be one of a hole transport zone or an electron transport zone. The nature or function of the first or second charge transport zones of an individual OLED or luminescent region as a hole transport zone or an electron transport zone depends upon the function of the electrode layer (first electrode, second electrode or intermediate layer) immediately adjacent the respective charge transport zone. Similarly, the composition of makeup of an intermediate electrode (or first or second electrode) is selected to provide an appropriate charge injecting layer depending on the nature of the layer or zone such as, for example, a charge transport zone immediately adjacent the respective electrode. For example, in embodiments, an intermediate electrode may have to function as a hole injecting layer on one side or surface in contact with a layer having a hole transport function (e.g., a hole transport zone) and also function as an electron injecting layer on the other side or surface in contact with a layer having an electron transport function (e.g., an electron transport zone). In such embodiments, an intermediate electrode may be a multi-layered configuration comprising a hole injecting layer and an electron injecting layer adjacent an appropriate layer of a luminescent region. In embodiments, when each of the intermediate electrodes functions as a hole injecting electrode on one side and functions as an electron injecting electrode on the other side, then the stacked OLED can be operated by applying an external forward-bias voltage across the entire stack by means of applying the external forward-bias voltage only across the first and second electrodes; or alternatively by applying an external forward-bias voltage across each individual unit of the stack separately by means of applying external forward-bias voltage across for example, the first electrode and the first intermediate electrode, the first intermediate electrode and the second intermediate electrode, and the second intermediate electrode and the second electrode. In embodiments, when one or more of the intermediate electrodes functions as a hole injecting electrode on both sides or when one or more of the intermediate electrodes functions as an electron injecting electrode on both sides, then the stacked OLED can be operated by applying an external forward-bias voltage across each of the individual units of the stack separately by means of applying external forward-bias voltage across for example, the first electrode and the first intermediate electrode, the first intermediate electrode and the second intermediate electrode, and the second intermediate electrode and the second electrode.

The configuration of the stacked OLED is not critical and may be selected as desired for a particular purpose or intended use. For example, using FIG. 1 as an example, in one embodiment, stacked OLED 100 could comprise an anode as the first electrode 120, a hole transport zone as each of the first charge transport zones 142, 152, and 162, and an electron transport zone as the second charge transport zones 146, 156, and 166. In this embodiment, intermediate electrodes 170 and 180 are multiple layered electrodes with an electron injecting layer adjacent the electron transport zones and a hole injecting layer adjacent the hole transport zones. If every individual OLED in the stacked configuration includes an electron transport zone as the second charge transport zone, then the electron transport zone in the last luminescent region (e.g., 160 if N is equal to 1) would be adjacent the second electrode 130 and the second electrode 130 is a cathode.

In another embodiment, the first electrode 120 is a cathode, each of the first charge transport zones 142, 152, and 162 are each electron transport zones, and each of the second charge transport zones 146, 156, and 166 are hole transport zones. In this embodiment, a hole transport zone is the zone underlying second electrode 130 and second electrode 130 is therefore an anode. The intermediate electrodes 170 and 180 are multiple layered electrodes with a hole injecting layer adjacent the hole transport zones and an electron injecting layer adjacent the electron transport zones. The above embodiments are merely exemplary embodiments, and other configurations and arrangements are possible.

Figure 2:
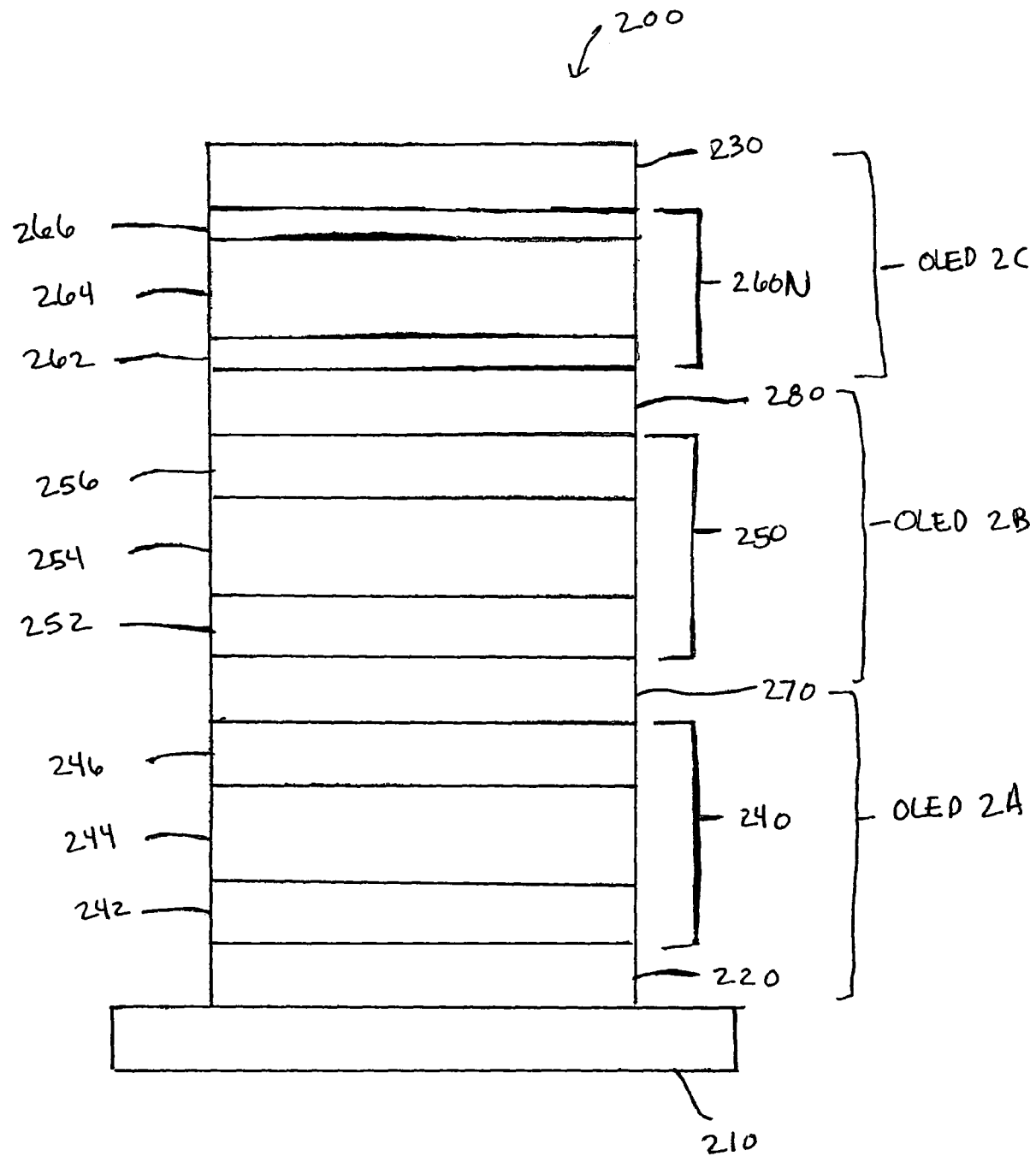
FIG. 2 is a schematic cross sectional view of another embodiment of a stacked OLED in accordance with the present disclosure.

With reference to FIG. 2, another embodiment of a stacked OLED is shown. Stacked OLED 200 comprises a substrate 210, an anode 220 an upper electrode 230, and a plurality of luminescent regions disposed between anode 210 and upper electrode 230. Luminescent region 240 is disposed over anode 220 and comprises hole transport zone 242 adjacent anode 220, light emitting layer or zone 244, and electron transport zone 246. Intermediate electrode 270 is disposed over luminescent region 240. Luminescent region 250 is disposed over intermediate electrode 270 and comprises electron transport zone 252, light emitting layer or zone 254, and hole transport zone 256. Intermediate electrode 280 is disposed over luminescent region 250. Luminescent region 260N is disposed over intermediate electrode 280 and comprises charge transport zone 262, light emitting layer or zone 264, and second charge transport zone 266, wherein N is 0, 1, or an integer greater than 1. Stacked OLED 200 is considered to comprise a plurality of OLEDs, e.g., OLEDs 2A, 2B, and 2C, formed by the respective luminescent regions adjacent an anode, cathode, and/or intermediate electrode. The OLED 200 may comprise additional or fewer OLEDs depending on the number of luminescent regions incorporated in the stacked OLED configuration.

Figure 3:
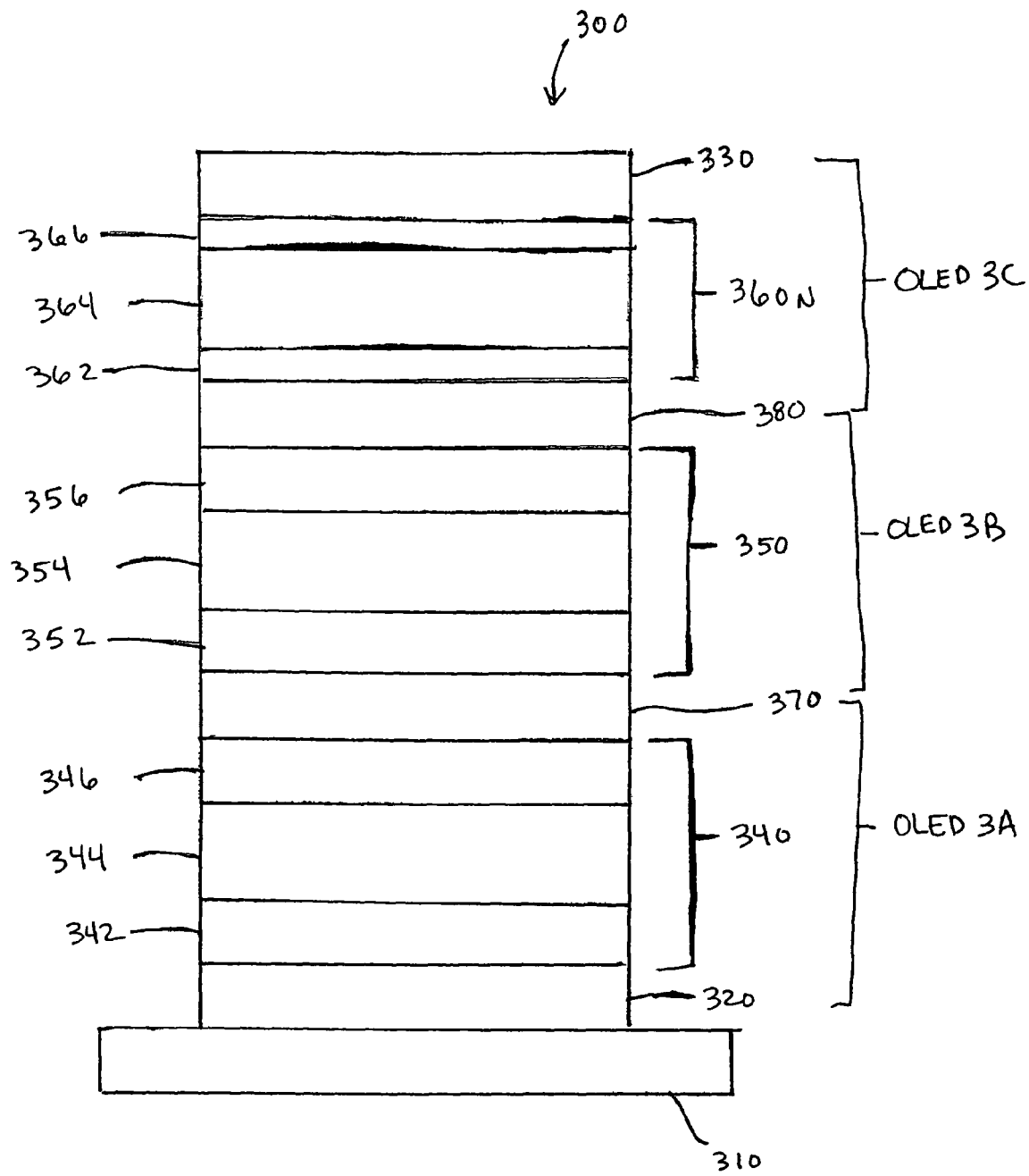
FIG. 3 is a schematic cross sectional view of still another embodiment of a stacked OLED in accordance with the present disclosure.

With reference to FIG. 3, a stacked OLED 300 comprises a substrate 310, a cathode 320, an upper electrode 330, and a plurality of luminescent regions disposed between the cathode 320 and the upper electrode 330. Luminescent region 340 is disposed over cathode 320. Luminescent region 340 comprises electron transport zone 342, light emitting layer or zone 344, and hole transport zone 346. Intermediate electrode 370 is disposed over luminescent region 340. Luminescent region 350 is disposed over intermediate electrode 370 and comprises hole transport zone 352, light emitting layers or zones 354, and electron transport zone 356. In this embodiment, intermediate electrode 370 is disposed between hole transport zones 346 and 352, and therefore comprises a hole injection material. Stacked OLED 300 may include N number of luminescent regions 360 wherein N is 0, 1, or an integer greater than 1. OLED 360 comprises a first charge transport zone 362, luminescent region 364 and a second charge transport zone 366. An intermediate electrode such as intermediate electrode 380 is disposed between any successive individual OLEDs. Stacked OLED 300 comprises a plurality of OLEDs, e.g., OLEDs 3A, 3B, and 3C, formed by the respective luminescent regions adjacent an anode, cathode, and/or intermediate electrode. The OLED may comprise additional or fewer OLEDs depending on the number of luminescent regions incorporated in the stacked OLED configuration.

In the embodiments in FIGS. 2 and 3, the first charge transport zones of successive luminescent regions have a charge transport function different from one another and the second charge transport zones of successive luminescent regions have a charge transport function different from one another such that an intermediate electrode is disposed between charge transport zones having the same charge transporting function. That is, in embodiments, the second charge transport layer of one luminescent region has the same charge transporting function as the first charge transport layer of the next successive luminescent region. In such an embodiment, an intermediate electrode can optionally be a single layer of an appropriate charge injecting material (i.e., hole injecting or electron ejecting). For example, in the embodiment in FIG. 2, intermediate electrode 270 is disposed between electron transport zones 246 and 252, and intermediate electrode 270 comprises an electron injecting material. If the pattern continued throughout the stacked OLED, then the upper electrode 230 is determined based on the number of luminescent regions 260 present in the stack: if N is 0 or an even integer, then upper electrode 230, in this embodiment, is an anode material (intermediate electrode 280 is eliminated if N is equal to 0; if N is equal to 1 or an odd integer, and charge transport layer 262 is a hole transport zone and charge transport zone 266 is an electron transport zone, then upper electrode is a cathode. In the embodiment in FIG. 3, intermediate electrode 370 is disposed between hole transport zones 246 and 352 and comprises a hole injecting material. If the convention that the first charge transport zones of successive luminescent regions have different functions is carried out throughout the stack, then the function and composition of the upper electrode 330 will depend on the N number of luminescent regions 360 present in the stack, with the upper electrode being a cathode if N is 0 or an even integer and an anode if N is 1 or an odd integer.

It will be appreciated that the embodiments described with reference to FIGS. 1, 2, and 3 are merely illustrative examples of possible embodiments of a stacked OLED in accordance with the present disclosure and not intended to limit the scope of a stacked OLED in accordance with the disclosure. The overall configuration of a stacked OLED, including the composition and/or function of the individual layers may be selected as desired for a particular purpose or intended use and are not limited to the specific embodiments described herein.

At least one luminescent region comprises a mixed region. As used herein, a mixed region comprises a mixture of at least two materials having different electron and hole transport capacities, and optionally a dopant; and wherein the mixed region there is at least one electroluminescent material capable of emitting light. The materials having different electron and hole transport capacities can be independently selected from hole transport materials, electron transport materials, and bipolar transport material. In one embodiment, the mixed region comprises two materials having different electron and hole transport capacities, one of which is an electroluminescent material capable of emitting light. In another embodiment, a mixed region comprises two materials having different electron and hole transport capacities optionally one of which is an electroluminescent material, and further comprises an electroluminescent dopant. In a further embodiment, a mixed region comprises two materials having different electron and hole transport capacities one of which is an electroluminescent material, and further comprises an electroluminescent dopant, In another embodiment, a mixed region comprises two materials having different electron and hole transport capacities, and further comprises a dopant, and at least one of the two materials or the dopant is an electroluminescent material.

The emission color of the mixed region is selected as desired for a particular purpose or intended use. The emission color of an individual OLED is based on the material chosen as the emitter in the mixed region. In embodiments in which a mixed region comprises a dopant and the dopant and at least one of the materials with the different electron and hole transport capacities is an emitter, the emission color from the mixed region depends on the energy transfer from the materials with the different electron and hole transport capacities to the dopant. For example, if the energy transfer is complete to the dopant, then the emission color from the individual OLED will be the emission color from the dopant. If the energy transfer to the dopant is not complete, then the emission color from the individual OLED is determined by emission colors of the materials with the different electron and hole transport capacities and the dopant.

The luminescent region of at least one of the individual OLEDs of the stacked OLED configuration comprises a mixed region. In embodiments, the luminescent region of each individual OLED comprises a mixed region. It will be appreciated that the number of individual OLEDs which include a mixed region as part of the luminescent region may be selected as desired for a particular purpose or intended use.

In one embodiment, the individual OLEDs of a stacked OLED may be made to emit different emission colors. In another embodiment, two or more individual OLEDs may be made to emit the same emission color. In still another embodiment two or more individual OLEDs may be made to emit a first color, two or more individual OLEDs may be made to emit a second color, and so forth. In an even further embodiment, all of the individual OLEDs of a stacked OLED configuration may be made to emit the same emission color to form a monochromatic stacked OLED. In a monochromatic stacked OLED, the luminescent regions of the individual OLEDs may have the same composition, or the luminescent regions may be of different compositions and materials wherein the respective compositions emit the same emission color.

The substrate can comprise various suitable materials including, for example, polymeric components, glass, quartz and the like. Suitable polymeric components include, but are not limited to polyesters, such as MYLAR®, polycarbonates, polyacrylates, polymethacrylates, polysulfones, and the like. Mixtures of these various materials can also be used. Other substrate materials can also be selected provided, for example, that the materials can effectively support the other layers and do not substantially interfere with the device's functional performance. In embodiments, the substrate is formed of a light transmission material.

The thickness of the substrate is not particularly limited except, for example, perhaps by the structural demands of the organic light emitting device and its intended use. Suitable thicknesses include, for example, from at least about 25 µm to about 10,000 µm. In embodiments, the substrate has a thickness of from about 100 µm to about 1,000 µm. Of course, thicknesses outside of these ranges are possible and within the scope of a stacked OLED in accordance with the present disclosure.

An anode may comprise suitable positive hole injecting electrodes, such as indium tin oxide (ITO), tin oxide, gold and platinum. Other suitable materials for the anode include, but are not limited to, electrically conductive carbon, π-conjugated polymers such as polyaniline, polythiophene, polypyrrole, and the like, having, for example, a work function equal to, or greater than, about 4 eV, and preferably from about 4 eV to about 6 eV.

The anode can be of any suitable form. A thin conductive layer may be coated onto a substrate such as, for example, a transparent or substantially transparent glass plate or plastic film, respectively, or a thin conductive layer may be coated on a hole transport zone. Embodiments of a stacked OLED in accordance with the present disclosure can comprise a light transmissive anode formed from tin oxide or indium tin oxide (ITO) coated on a glass plate. Also, very thin light-transparent metallic anodes having a thickness, for example, of less than about 200 Å, and in some embodiments from about 75 Å to about 150 Å can be used. These thin anodes can comprise metals such as gold, palladium and the like. In addition, transparent or semi-transparent thin layers of conductive carbon or conjugated polymers, such as polyaniline, polythiophene, polypyrrole and the like, having a thickness of, for example, from 50 Å to about 175 Å can be used as anodes. Additional suitable forms of an anode are disclosed in U.S. Pat. No. 4,885,211, the disclosure of which is incorporated herein by reference in its entirety.

The thickness of the anode can range from about 1 nanometer to about 5,000 nanometers. Thicknesses outside of this range can also be used it is believed. The range may depend on the optical constants of the anode material. The thickness of the anode is, in embodiments, from about 30 nanometers to about 300 nanometers. The anode can be formed using any suitable thin film forming method, such as vapor deposition in vacuum, spin-coating, electron-beam deposition and sputtering deposition.

A hole transport material selected to form the hole transport zones and the mixed region(s) can be any suitable known or later developed material. Suitable hole transport materials include, but are not limited to, conductive materials such as polyaniline and its acid-doped forms, polypyrrole, poly(phenylene vinylene), and other suitable semiconductive organic materials. Mixtures of these and other suitable materials can also be used. A suitable class of hole transporting materials are the aromatic tertiary amines such as those disclosed in U.S. Pat. No. 4,539,507, the disclosure of which is totally incorporated herein by reference. Suitable exemplary aromatic tertiary amines include, but are not limited to, bis(4-dimethylamino-2-methylphenyl)phenylmethane, N,N,N-tri (p-tolyl)amine, 1,1-bis(4-di-p-tolylaminophenyl)cyclohexane, 1,1-bis(4-di-p-tolylaminophenyl)-4-phenyl cyclohexane, N,N'-diphenyl-N,N'-bis(3-methylphenyl)-1,1'-biphenyl-4,4'-diamine, N,N'-diphenyl-N,N'-bis(3-methylphenyl)-1,1'-biphenyl-4,4'-diamine, N,N'-diphenyl-N,N'-bis(4-methoxyphenyl)-1,1'-biphenyl-4,4'-diamine, N,N,N', N'-tetra-p-tolyl-1,1'-biphenyl-4,4'-diamine, N,N'-di-1-naphthyl-N,N'-diphenyl-1,1'-biphenyl-4,4'-diamine, mixtures thereof, and the like.

Another class of aromatic tertiary amines suitable for the hole transport material is the polynuclear aromatic amines. Examples of such polynuclear aromatic amines include, but are not limited to, N,N-bis-[4'-(N-phenyl-N-m-tolylamino)-4-biphenylyl]aniline; N,N-bis-[4'-(N-phenyl-N-m-tolylamino)-4-biphenylyl]-m-toluidine; N,N-bis-[4'-(N-phenyl-N-m-tolylamino)-4-biphenylyl]-p-toluidine; N,N-bis-[4'-(N-phenyl-N-p-tolylamino)-4-biphenylyl]aniline; N,N-bis-[4'-(N-phenyl-N-p-tolylamino)-4-biphenylyl]-m-toluidine; N,N-bis-[4'-(N-phenyl-N-p-tolylamino)-4-biphenylyl]-p-toluidine; N,N-bis-[4'-(N-phenyl-N-p-chlorophenylamino)-4-biphenylyl]-m-toluidine; N,N-bis-[4'-(N-phenyl-N-m-chlorophenylamino)-4-biphenylyl]-m-toluidine; N,N-bis-[4'-(N-phenyl-N-m-chlorophenylamino)-4-biphenylyl]-p-toluidine; N,N-bis-[4'-(N-phenyl-N-m-tolylamino)-4-biphenylyl]-p-chloroaniline; N,N-bis-[4'-(N-phenyl-N-p-tolylamino)-4-biphenylyl]-m-chloroaniline; N,N-bis-[4'-(N-phenyl-N-m-tolylamino)-4-biphenylyl]-1-aminonaphthalene, mixtures thereof, and the like.

A further class of suitable hole transporting materials are 4,4'-bis(9-carbazolyl)-1,1'-biphenyl compounds. Illustrative examples of 4,4'-bis(9-carbazolyl)-1,1'-biphenyl compounds include 4,4'-bis(9-carbazolyl)-1,1'-biphenyl and 4,4'-bis(3-methyl-9-carbazolyl)-1,1'-biphenyl, and the like. An exemplary class of the hole transport materials being the indolocarabazoles, such as, for example, 5,11-di-naphthyl-5,11-dihydroindolo[3,2-b]carbazole and 2,8-dimethyl-5,11-di-naphthyl-5,11-dihydroindolo[3,2-b]carbazole, and others as those described in U.S. Pat. No. 5,942,340, the disclosure of which is totally incorporated herein by reference. Other suitable materials include N,N,N'N'-tetraarylbenzidines wherein aryl may be selected from phenyl, m-tolyl, p-tolyl, m-methoxyphenyl, p-methoxyphenyl, 1-naphthyl, 2-naphthyl, and the like. Illustrative examples of N,N,N',N'-tetraarylbenzidines are N,N'di-naphthyl-N,N'-diphenyl-1,1'-biphenyl-4,4'-diamine, N,N'-bis(3-methylphenyl)-N,N'-diphenyl-1,1'-biphenyl-4,4'-diamine; N,N'-bis(3-methoxyphenyl)-N,N'-diphenyl-1,1'-biphenyl-4,4'-diamine, and the like. Still other suitable hole transport materials also include the naphthyl-substituted benzidine derivatives.

A hole transport zone can further comprise at least one buffer layer (not shown) comprised of a material with certain hole injection and transport properties, and selected such that, for example, device performance is improved. Suitable materials that can be utilized in the buffer layer include semiconductive organic materials, such as, for example, porphyrin derivatives like 1,10,15,20-tetraphenyl-21H,23H-porphyrin copper (II) disclosed in U.S. Pat. No. 4,356,429, the disclosure of which is totally incorporated herein by reference; copper phthalocyanine, copper tetramethyl phthalocyanine, zinc phthalocyanine, titanium oxide phthalocyanine, magnesium phthalocyanine, and the like. Mixtures of these and other suitable materials can also be used. Other suitable materials that can be utilized in the buffer layer include semiconductive and insulative metal compounds, such as for example metal oxides like MgO, $Al_2O_3$, BeO, BaO, AgO, SrO, SiO, $SiO_2$, $ZrO_2$, CaO, $Cs_2O$, $Rb_2O$, $Li_2O$, $K_2O$ and $Na_2O$; and metal halides like LiF, KCl, NaCl, CsCl, CsF and KF.

A hole transport zone optionally including a buffer layer, can be prepared by forming, for example, one of the above-described materials into thin films by any suitable known or later developed method. Suitable methods for this purpose include, for example, vapor deposition and spin coating techniques.

A buffer layer can be located at any position within the hole transport zone. That is, it can be located such that one surface of the buffer layer coincides with one surface of the hole transport zone. In this embodiment the buffer layer is contacting either an anode, intermediate electrode or the mixed region or it can be located such that the two surfaces of the buffer layer are in between two surfaces of a hole transport zone. However, in embodiments a buffer layer is in contact with an anode or hole injecting intermediate cathode.

A hole transport zone, optionally including a buffer layer, can have a thickness ranging from about 5 nanometers to about 500 nanometers. A buffer layer can have a thickness ranging from about 1 nanometer to about 100 nanometers. The thickness of a buffer layer is, for example, at least 1 nanometer less than the thickness of a hole transport zone which comprises a buffer layer. In embodiments, the thickness range for a buffer layer is from about 5 nanometers to about 25 nanometers. In other embodiments, the thickness range for a buffer layer is from about 1 nanometer to about 5 nanometers.

From Z. D. Popovic et al., *Proceedings of the SPIE*, Vol. 3176, "Organic Light-Emitting Materials and Devices II," San Diego, Calif., Jul. 21-23, 1998, pp. 68-73, the disclosure of which is totally incorporated herein by reference, and U.S. Pat. No. 6,392,339, the disclosure of which is totally incorporated herein by reference, it is known that the thickness of a hole transport zone may have an influence on the performance of the organic light emitting device. It has also been determined that the thickness of a hole transport zone exclusive of the thickness of a buffer layer in the hole transport zone also has an influence on the performance of the device where, in general, reducing the thickness of the hole transport zone without reducing the thickness of the buffer layer in it can lead to a desirable increase in device stability and, in the same time, to an undesirable decrease in device efficiency. There is, therefore, a desirable thickness range for a hole transport zone for a particular thickness of the buffer layer in that region. In one embodiment, the thickness range for a hole transport region, exclusive of the thickness of a buffer layer (the remaining thickness of the hole transport region after the thickness of a buffer layer is subtracted) is from about 5 nanometers to about 15 nanometers. In another embodiment, the thickness range for a hole transport region, exclusive of the thickness of a buffer layer is from about 15 nanometers to about 75 nanometers.

In some embodiments, it may be desirable that an individual OLED comprise only one of a hole transport zone or an electron transport zone. That is, a light emitting layer or zone, such as a mixed region, may be in direct contact with one of the first electrode, the second electrode, or an intermediate electrode.

The electron transport material selected to form an electron transport zone or a mixed region can be any suitable known or later developed material. Suitable electron transport materials that can be used in an electron transport zone and a mixed region include the metal oxinoid compounds, such as the metal chelates of 8-hydroxyquinoline as disclosed in U.S. Pat. Nos. 4,539,507; 5,151,629; 5,150,006 and 5,141,671, the disclosures of each being totally incorporated herein by reference. Illustrative examples include tris(8-hydroxyquinolinate)aluminum ($AlQ_3$). Another example is bis(8-hydroxyquinolato)-(4-phenylphenolato)aluminum (Balq). Other examples include tris(8-hydroxyquinolinate)gallium, bis(8-hydroxyquinolinate) magnesium, bis(8-hydroxyquinolinate) zinc, tris(5-methyl-8-hydroxyquinolinate)aluminum, tris(7-propyl-8-quinolinolato)aluminum, bis[benzo{f}-8-quinolinate]zinc, bis(10-hydroxybenzo[h]quinolinate) beryllium, and the like.

Other classes of electron transport materials that can be used in an electron transport zone or a mixed region include stilbene derivatives, such as those disclosed in U.S. Pat. No. 5,516,577, the disclosure of which is totally incorporated herein by references including, for example, 4,4'-bis(2,2-diphenylvinyl)biphenyl; the electron transport materials comprised of the metal thioxinoid compounds such as those illustrated in U.S. Pat. No. 5,846,666, the disclosure of which is totally incorporated herein by reference, such as metal thioxinoid compounds of bis(8-quinolinethiolato)zinc, bis(8-quinolinethiolato)cadmium, tris(8-quinolinethiolato)-gallium, tris(8-quinolinethiolato)indium, bis(5-methylquinolinethiolato)zinc, tris(5-methylquinolinethiolato)gallium, tris(5-methylquinolinethiolato)indium, bis(5-methylquinolinethiolato)cadmium, bis(3-methylquinolinethiolato) cadmium, bis(5-methylquinolinethiolato)zinc, bis[benzo{f}-8-quinolinethiolato]zinc, bis[3-methyl-benzo{f}-8-quinolinethiolato]zinc, bis[3,7-dimethylbenzo{f}-8-quinolinethiolato]zinc, and the like; the oxadiazole metal chelates disclosed in U.S. Pat. No. 5,925,472, the disclosure of which is totally incorporated herein by reference, such as bis[2-(2-hydroxyphenyl)-5-phenyl-1,3,4-oxadiazolato]zinc; bis[2-(2-hydroxyphenyl)-5-phenyl-1,3,4-oxadiazolato]beryllium; bis[2-(2-hydroxyphenyl)-5-(1-naphthyl)-1,3,4-oxadiazolato]zinc; bis[2-(2-hydroxyphenyl)-5-(1-naphthyl)-1,3, 4-oxadiazolato]beryllium; bis[5-biphenyl-2-(2-hydroxyphenyl)-1,3,4-oxadiazolato]zinc; bis[5-biphenyl-2-(2-hydroxyphenyl)-1,3,4-oxadiazolato]beryllium; bis[(2-hydroxyphenyl)-5-phenyl-1,3,4-oxadiazolato]lithium; bis[2-(2-hydroxyphenyl)-5-p-tolyl-1,3,4-oxadiazolato]zinc; bis[2-(2-hydroxyphenyl)-5-p-tolyl-1,3,4-oxadiazolato]beryllium; bis[5-(p-tert-butylphenyl)-2-(2-hydroxyphenyl)-1,3,4-oxadiazolato]zinc; bis[5-(p-tert-butylphenyl)-2-(2-hydroxyphenyl)-1,3,4-oxadiazolato]beryllium; bis[2-(2-hydroxyphenyl)-5-(3-fluorophenyl)-1,3,4-oxadiazolato]zinc; bis[2-(2-hydroxyphenyl)-5-(4-fluorophenyl)-1,3,4-oxadiazolato] zinc; bis[2-(2-hydroxyphenyl)-5-(4-fluorophenyl)-1,3,4-oxadiazolato]beryllium; bis[5-(4-chlorophenyl)-2-(2-hydroxyphenyl)-1,3,4-oxadiazolato]zinc; bis[2-(2-hydroxyphenyl)-5-(4-methoxyphenyl)-1,3,4-oxadiazolato] zinc; bis[2-(2-hydroxy-4-methylphenyl)-5-phenyl-1,3,4-oxadiazolato]zinc; bis[2-α-(2-hydroxynaphthyl)-5-phenyl-1,3,4-oxadiazolato]zinc; bis[2-(2-hydroxyphenyl)-5-p-pyridyl-1,3,4-oxadiazolato]zinc; bis[2-(2-hydroxyphenyl)-5-p-pyridyl-1,3,4-oxadiazolato]-beryllium; bis[2-(2-hydroxyphenyl)-5-(2-thiophenyl)-1,3,4-oxadiazolato]zinc; bis[2-(2-hydroxyphenyl)-5-phenyl-1,3,4-thiadiazolato]zinc; bis[2-(2-hydroxyphenyl)-5-phenyl-1,3,4-thiadiazolato]beryllium; bis[2-(2-hydroxyphenyl)-5-(1-naphthyl)-1,3,4-thiadiazolato]-zinc; and bis[2-(2-hydroxyphenyl)-5-(1-naphthyl)-1,3,4-thiadiazolato]beryllium, and the like; the triazines illustrated in U.S. Pat. Nos. 6,057,048 and 6,821,643, the disclosures of each being totally incorporated herein by reference. Another class of materials suitable for a mixed region are the anthracene derivatives.

An electron transport zone can comprise an electron transport material with a thickness ranging, for example, from about 5 nanometers to about 500 nanometers. In embodiments, this thickness is from about 20 nanometers to about 80 nanometers. A thickness outside of these ranges can also be used it is believed. In embodiments such as with the organic light emitting device comprising a multiple-layered electron transport region, the individual layers have a thickness of at least about 1 nanometer.

A class of bipolar transport materials that can be used in a mixed region comprises anthracenes, such as, for example 2-t-butyl-9,10-di-(2-naphthyl) anthracene, 9,10-di-(2-naphthyl)anthracene, 9,10-di-phenyl anthracene, 9,9-bis[4-(9-anthryl)phenyl]fluorine, and 9,9-bis[4-(10-phenyl-9-anthryl) phenyl]fluorine. Other suitable anthracenes are disclosed in U.S. application Ser. No. 09/208,172, now U.S. Pat. No. 6,465,115 (corresponding to EP 1009044 A2), those disclosed in U.S. Pat. No. 5,972,247, those disclosed in U.S. Pat. No. 5,935,721, and U.S. application Ser. No. 09/771,311, now U.S. Pat. No. 6,479,172, the disclosures of which are totally incorporated herein by reference.

A class of dopant materials that can also be utilized in a mixed region are the fused ring fluorescent dyes. Examples of the fused ring fluorescent dyes include perylene, rubrene, anthracene, coronene, phenanthrecene, pyrene, and the like, as described in U.S. Pat. No. 3,172,862, the disclosure of which is totally incorporated herein by reference. Fluorescent materials that can be used as a dopant include butadienes, such as 1,4-diphenylbutadiene and tetraphenyl butadiene, stilbenes, and the like, as described in U.S. Pat. Nos. 4,356,429 and 5,516,577, the disclosures of which are totally incorporated herein by reference. Other examples of dopant materials are those described in U.S. Pat. No. 5,601,903, the disclosure of which is totally incorporated herein by reference. Other fluorescent dyes that can be utilized in a mixed region include those disclosed in U.S. Pat. No. 5,935,720, the disclosure of which is totally incorporated here by reference, such as, for example, 4-(dicyanomethylene)-2-1-propyl-6-(1, 1,7,7-tetramethyljulolidyl-9-enyl)-4H-pyran (DCJTB). Another class of dopant materials that can be utilized in a mixed region is the lanthanide metal chelate complexes, such as for example, tris(acetylacetonato)(phenanthroline)terbium, tris(acetyl acetonato)(phenanthroline)europium, and tris(thenoyl trisfluoroacetonato)(phenanthroline)europium, and those disclosed in Kido et al., "White light emitting organic electroluminescent device using lanthanide complexes", *Jpn. J. Appl. Phys., Volume* 35, pp. L394-L396 (1996). Another class of dopant materials that can be utilized in a mixed region is the phosphorescent materials, such as, for example, organometallic compounds containing a heavy metal atom that lead to strong spin-orbit coupling, such as those disclosed in Baldo, et al., "Highly efficient organic phosphorescent emission from organic electroluminescent devices", *Letters to Nature, Volume* 395, pp 151-154 (1998). Examples of such phosphorescent materials include 2,3,7,8, 12,13,17,18-octaethyl-21H, 23H-phorpine platinum(II) (PtOEP) and fac-tris(2-phenylpyridine)iridium ($Ir(ppy)_3$).

In embodiments, the mixed region comprises a mixture of at least two materials having different electron and hole transport capacities. The two materials can be any two materials that have different hole mobility and/or different electron mobility.

In general, a material is considered to be a hole transport material if its hole mobility is at least about 10 times higher than its electron mobility. Moreover, a material is considered to be an electron transport material if its electron mobility is at least about 10 times higher than its hole mobility. Further-more, a material is considered to be a bipolar transport material if its hole mobility is equal to its electron mobility, if its hole mobility exceeds its electron mobility by no more than 10 times or if its electron mobility exceeds its hole mobility by no more than 10 times.

The two materials having different electron and hole transport capacities can be independently selected from hole transport materials, electron transport materials and bipolar transport materials, illustrative examples of which have been given above. For example, both materials can be hole transport materials, both materials can be electron transport materials, both materials can be bipolar transport materials, one material can be a hole transport material and the other material can be an electron transport material, one material can be a hole transport material and the other material can be a bipolar transport material, or one material can be an electron transport material and the other material can be a bipolar transport material.

In embodiments when the mixture comprises two hole transport materials, the two materials are selected such that the hole mobility of one material is at least two times higher than the hole mobility of the other material. In embodiments when the mixture comprises two electron transport materials, the two materials are selected such that the electron mobility of one material is at least two times higher than the electron mobility of the other material. In embodiments when the mixture comprises two bipolar transport materials, the two materials are selected such that the hole mobility of one material is at least two times higher than the hole mobility of the other material and/or the electron mobility of one material is at least two times higher than the electron mobility of the other material.

A mixed region can comprise from about 5 volume percent to about 95 volume percent of one of the said two materials, and from about 95 volume percent to about 5 volume percent of the other of the said two materials. A mixed region can further optionally comprise from about 0.01 volume percent to about 25 volume percent of a dopant material. In embodiments, a mixed region comprises from about 30 volume percent to about 70 volume percent of one of the said two materials, from about 70 volume percent to about 30 volume percent of the other of the said two materials, and can optionally further comprise from about 0.05 volume percent to about 10 volume percent of a dopant material. In other embodiments, a mixed region may comprise from about 40 volume percent to about 60 volume percent of one of the said two materials, from about 60 volume percent to about 40 volume percent of the other of the said two materials, and optionally from about 0.1 volume percent to about 2 volume percent of a dopant material. In other embodiments, a dopant material in a mixed region may be present in an amount from about 5 volume percent to about 20 volume percent.

It will be appreciated that in a stacked OLED wherein more than one individual OLED comprises a mixed region, the mixed regions of the individual OLEDs may be of the same or different compositions with respect to one or both of the materials used to form the mixed region, and the concentration of the materials in the mixed region(s).

A mixed region can be formed by any suitable method that enables the formation of selected mixtures of materials, and optional dopant materials. For example, a mixed region can be formed by co-evaporating the hole transport material(s), electron transport material(s), and optionally dopant material(s) to form a mixed region.

The thickness of a mixed region can vary from, for example, about 1 nanometer to about 1000 nanometers. In embodiments, the thickness of a mixed region is from about 10 nanometers to about 200 nanometers. In other embodiments, the thickness of a mixed region is from about 20 nanometers to about 100 nanometers. Thicknesses outside of these ranges, however, may also be used. In embodiments wherein a stacked OLED includes two or more individual OLEDs that each comprises a mixed region, the mixed regions may have the same or different thicknesses. The thickness of the respective mixed regions may be selected as desired for a particular purpose or intended use and may allow for tuning the electrical properties of the stacked OLED device.

A mixed region can comprise more than one layer. For example, a mixed region can selectively be formed to include two, three or even more separate layers. In these embodiments, the mixing ratios of the two materials having different electron and hole transport capacities can be the same in each of the layers, or the mixing ratios can be varied in the layers. For example, the multiple layers can each comprise an equal weight percentage of hole transport material(s) and electron transport material(s). In other embodiments, the mixed region can comprise different amounts of these materials. Additionally, the compositions of the individual layers of a mixed region may be the same or different. Adjacent layers having the same material make up are considered different layers if at least one of the respective materials is present in different concentrations.

Examples of suitable mixed regions for use in a stacked OLED in accordance with the present disclosure include, but are not limited to, those disclosed in U.S. Pat. Nos. 6,392,250; 6,392,339; 6,614,175; 6,737,177; 6,753,098; 6,759,146; and 6,773,830, the entire disclosures of which are incorporated herein by reference.

A cathode can comprise any suitable metal, including high work function components, having a work function, for example, from about 4 eV to about 6 eV, or low work function components, such as metals with, for example, a work function of from about 2.5 eV to about 4 eV. The cathode can comprise a combination of a low work function (less than about 4 eV) metal and at least one other metal. Effective proportions of the low work function metal to the second or other metal are from less than about 0.1 weight percent to about 99.9 weight percent, and more specifically, from about 3 to about 45 weight percent. Illustrative examples of low work function metals include, but are not limited to, alkaline metals such as lithium or sodium; Group 2A or alkaline earth metals such as beryllium, magnesium, calcium or barium; and Group III metals including rare earth metals and the actinide group metals such as scandium, yttrium, lanthanum, cerium, europium, terbium or actinium. Lithium, magnesium and calcium are preferred low work function metals. The Mg—Ag alloy cathodes of U.S. Pat. No. 4,885,211, the disclosure of which is totally incorporated herein by reference, disclose one preferred cathode construction. Another cathode construction is described in U.S. Pat. No. 5,429,884, the disclosure of which is totally incorporated herein by reference, wherein the cathode is formed from lithium alloys with other high work function metals such as aluminum and indium. Another suitable material for a cathode is aluminum metal.

A cathode can comprise at least one transparent conducting material, such as for example, indium-tin-oxide (ITO), and other materials, such as, for example, those disclosed in U.S. Pat. Nos. 5,703,436 and 5,707,745, the disclosures of which are totally incorporated herein by reference.

The thickness of a cathode can range from, for example, about 10 nanometers to about 500 nanometers, and more specifically, from about 25 to about 300 nanometers, although thicknesses outside of these ranges may be used. A cathode can be formed using any suitable thin film forming method. Exemplary methods for forming the cathode include, but are not limited to, vapor deposition in vacuum, electron-beam deposition, and sputtering deposition.

A stacked OLED may include a thermal protective element (not shown), formed of at least one layer comprising at least one material with certain thermal properties such that the resistance of the stacked OLED to shorting at elevated temperatures is increased. Among the desired thermal properties of the materials comprising a thermal protective element are the thermal expansion properties, where certain ranges for these properties are preferred, such as, for example, less than about $9 \times 10^{-6}$ (° C.$^{-1}$), and preferably, for example, less than about $4 \times 10^{-6}$ (° C.$^{1}$) with no specific lower limits to these properties. The ranges are selected based on the thermal properties of the other materials comprising the stacked OLED, especially the thermal properties of the materials comprising the substrate, the hole transport zone and the mixed regions, and the electron transport zones, so that the susceptibility of a stacked OLED to shorting at high temperatures is eliminated, minimized, or substantially reduced. The materials utilized in a thermal protective element, can be selected from any suitable class of materials, such as, for example, organic compounds, inorganic materials, metallic materials, and mixtures thereof. Illustrative examples of materials that can be utilized in the thermal protective element are disclosed in copending application U.S. Ser. No. 09/077,7154, the disclosure of which is totally incorporated herein by reference, of which metal oxides, such as, for example, $Al_2O_3$, SiO, $SiO_2$, $ZrO_2$, are suitable examples. The thickness of a thermal protective element can be from about 1 nanometer to about 100 microns, although there may be no upper limit to the thickness except as may be required due to limitations in the fabrication technique or as may be required to avoid detrimental effects on other performance characteristics of the OLED or added costs. A suitable thickness range for a thermal protective element is, for example, from about 10 nanometers to about 1,000 nanometers.

A thermal protective element can be prepared by forming one of the above-described materials into thin films by any suitable known or later developed method. Suitable methods for this purpose include, for example, vapor deposition, sputtering, electron beam, arc evaporation and spin coating techniques. Of these methods, vapor deposition and sputtering are preferred.

An intermediate electrode may comprise any suitable hole injecting material or electron injecting material depending on whether an electrode is required to function as a hole injecting contact or an electron injecting contact or both. Along these lines, depending on the manner in which the electrode must function, the intermediate electrodes may be a single layer or a multiple layer electrode. For example, when an intermediate electrode contacts a hole transport zone on each side, the intermediate electrode may comprise a single layer of a hole injecting material, or a multiple layer configuration wherein the layers adjacent the respective hole transport zones comprises a hole injecting material. Similarly, when an intermediate electrode contacts electron transport zones on each side, an intermediate electrode may be a single layer comprising an electron injecting material, or a multiple layer configuration wherein the layers adjacent the respective electron transport zones comprise an electron injecting material. When one side of an intermediate electrode contacts a layer having a hole transport function and the opposite side of an intermediate electrode contacts a layer having an electron transport function, the intermediate electrode is, in embodiments, a multiple layer electrode with a layer comprising a hole injecting material adjacent the hole transport layer and a layer comprising an electron injecting material adjacent the electron transport layer.

Suitable materials for the intermediate electrodes includes ITO, $V_2O_5$, thin layers of Mg:Ag. Alternatively, the intermediate electrode may comprise a metal-organic mixed layer (MOML) such as those described in U.S. Pat. No. 6,841,932 and U.S. patent application Ser. No. 10/401,238, the entire disclosures of which are incorporated herein by reference. Additionally, the intermediate electrode can be of a configuration as described in copending application Ser. No. 11/133,978, the entire disclosure of which is incorporated herein by reference, in which an MOML is, in some cases, disposed between a hole injecting layer and an electron injecting layer, the hole injecting layer comprising an electron accepting material having a property of oxidizing organic compounds.

An electron injection layer can comprise at least one material that increases the injection of electrons from a cathode or intermediate electrode into an electron transport zone. Illustrative examples of materials that can be used in the electron injection layer include, but are not limited to, metal compounds and suitable organic semiconductive materials.

Suitable metal compounds that can be utilized in an electron injection layer include the alkaline earth metal oxides like SrO, CaO, BaO and others, such as those disclosed in U.S. Pat. Nos. 5,457,565 and 5,739,635, the disclosures of which are totally incorporated herein by reference, and other metal oxides such as $Al_2O_3$, SiO and $SiO_2$. Other suitable electron injecting materials include metals such as, but not limited to Ca, Li, K, Na, Mg, Al, In, Y, Sr, Cs, Cr, Ba, Sc and compounds thereof. A suitable class of metal compounds that can be utilized in an electron injection layer are the alkaline metal halides, such as, for example, LiF, LiCl, NaCl, KF, KCl and others as those disclosed in the above referenced U.S. Pat. No. 5,739,635 and also those disclosed in U.S. Pat. No. 5,776,622, the disclosures of which are totally incorporated herein by reference.

Suitable organic semiconductive materials that can be used in an electron injection layer include materials or components that permit high energy deposition of the cathode. Examples of these materials can be selected from the porphyrin and the naphthacene compounds of which copper phthalocyanine is one example. An electron injection layer can further include at least one dopant comprised of an electron injecting dopant, such as for example Li.

An electron injection layer of an intermediate electrode can have a thickness ranging, for example, from about 1 nanometer to about 100 nanometers. In embodiments, the thickness range for an electron injection layer is from about 1 nanometer to about 10 nanometers. Another suitable thickness range for an electron injection layer is from about 10 nanometers to about 100 nanometers. An electron injection layer can be formed using any suitable thin film forming method, such as vapor deposition in vacuum, electron-beam deposition, and sputtering deposition, wherein the vapor deposition in vacuum is a preferred method.

Examples of hole injecting materials suitable for an intermediate electrode include those materials previously described herein as suitable as an anode. In other embodiments, the hole injecting material can comprise an electron-accepting material than can oxize an organic compound in a luminescent region. Suitable electron-accepting materials include inorganic compounds such as those described in U.S. Pat. No. 6,423,429 to Kido, et al., the entire disclosure of which is incorporated herein by reference. Such inorganic compounds include Lewis acids such as $FeCl_3$, $AlCl_3$, $GaCl_3$, InCl$_3$, SbCl$_5$, and combinations thereof. Suitable electron-accepting organic materials included, but are not limited to trinitrofluorenone, and 2,3,5,6-tetrafluoro-7,7,8,8-tetrasyanoquinodimethne (F$_4$-TCNQ). Hole injecting layers comprising an electron-accepting material as described above may optionally comprise an organic material such as a hole transport material. Suitable hole transport materials include those previously described herein including but not limited to, NPB, MTDATA, BP-TPD, CuPc, VOPC, PEDOT, PAN,i and the like. Such hole injecting layers are amenable to vapor deposition techniques. Anode configurations comprising an electron-accepting material and optionally a hole transport material are described in copending applications Ser. No. 11/133,977 and 11/133,978, the entire disclosure of which is incorporated herein by reference. In embodiments, a hole injecting layer of an intermediate electrode comprises only an electron-accepting material or combination of electron-accepting materials. In other embodiments, a hole injecting layer of an intermediate electrode comprises an electron-accepting material or combination of electron-accepting materials and a hole transport material. In embodiments, the ratio of electron-accepting material to hole transport material in a hole injecting layer of an intermediate electrode is from about 10:90 to about 90:10 volume percent. A hole injection layer of an intermediate electrode can have a thickness ranging, for example, from about 1 nanometer to about 100 nanometers. In embodiments, the thickness range for a hole injection layer is from about 1 nanometer to about 10nanometers. Another suitable thickness range for a hole injection layer is from about 10 nanometers to about 100 nanometers. A hole injection layer can be formed using any suitable thin film forming method, such as vapor deposition in vacuum, electron-beam deposition, and sputtering deposition, wherein the vapor deposition in vacuum is a preferred method.

It will be appreciated that various properties of a stacked OLED may be adjusted or tuned as desired by varying the thickness of any layer of the stacked OLED such as, for example, by changing the thickness of a mixed region, and the like.

Stacked OLEDs in accordance with the present disclosure, which include at least one OLED with a mixed region, are further described with reference to the following examples. The following examples are merely illustrative and not intended to be limiting in any manner.

EXAMPLES

Example I

Figure 4:
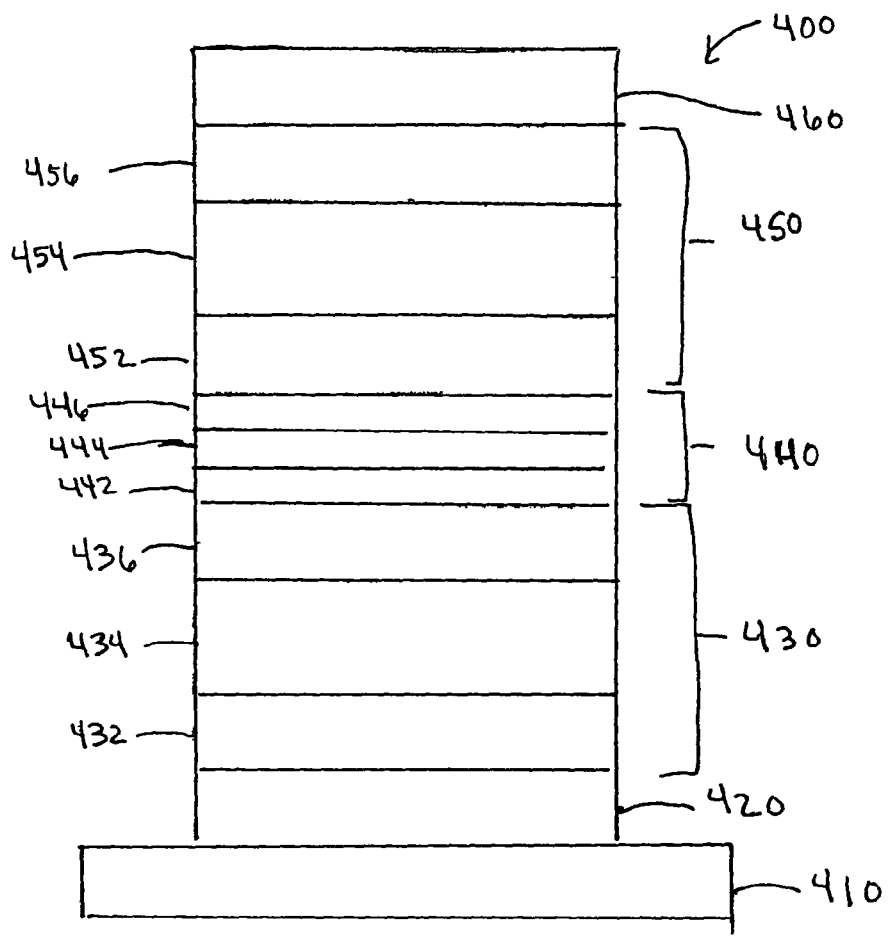
FIG. 4 is a schematic cross sectional view of a stacked OLED of Example I.

A first stacked OLED device was prepared having a structure as shown in FIG. 4. Stacked OLED 400 comprises a substrate 410, anode 420, luminescent region 430, luminescent region 450, intermediate electrode 440 disposed between luminescent regions 430 and 450, and cathode 460. Luminescent Regions 430 and 450 each include a bottom hole transport zone (432 and 452, respectively), a mixed region (434 and 454, respectively) and an upper electron transport zone (436 and 456, respectively). The stacked OLED was fabricated using physical vapor deposition in vacuum (5×10$^{-6}$ Torr) on ITO coated glass substrates, with the ITO serving as the bottom anode. The mixed regions 434 and 454 had a thickness of 800 angstroms and included N,N'-di(naphthalene-1-yl)-N,N'-diphenyl-benzidine (NPB) as the hole transport material, tris(8-hydroxyquinoline)aluminum (AlQ$_3$) as the electron transport material and (C545T) coumarine dye (10-(2-Benzothiazolyl)-2,3,6,7-tetrahydro-1,1,7,7,-tetramethyl1-1H,5H,11H-[1]benzopyrano[6,7,8-ij]quinolizin-11-one)] green emitting dopant. The cathode 460 was formed from Mg:Ag. The intermediate electrode 440 was a multiple layered electrode comprising a metal-organic mixed layer of AlQ$_3$/Ag(90:10) having a thickness of 500 angstroms interposed between a layer of LiF having a thickness of 10 angstroms as an electron injecting material layer, and a layer of NPB+10% F$_4$-TCNQ having a thickness of 200 angstroms as the hole injecting material layer.

The device was driven using a current density of around 31.25 mA/cm$^2$ and produced a green emission at a brightness (luminance) of 3910 cd/m$^2$. The luminance value translates to an electro luminescence efficiency of 12.5 cd/A. The CIE color coordinates were (0.327, 0.617), which amounts to saturated green emission for the device. The driving voltage for the device was 13.4 V.

Example II

A stacked OLED device was prepared that was identical to the device of Example I in all aspects except that the thickness of each of the mixed regions 434 and 454 of the respective luminescent regions 430 and 450 was 400 angstroms instead of 800 angstroms. When driven at a density of 25 mA/cm$^2$, the driving voltage was only 9.5 V, but the device had an electroluminescence efficiency of 12.4 cd/A, which is comparable to that of the device of Example I. Thus, by optimizing the thickness of the mixed layers in a stacked OLED, the driving voltage of the device may be reduced while still maintaining a high electroluminescence efficiency (greater than 10 cd/A).

Comparative Example I

Figure 5:
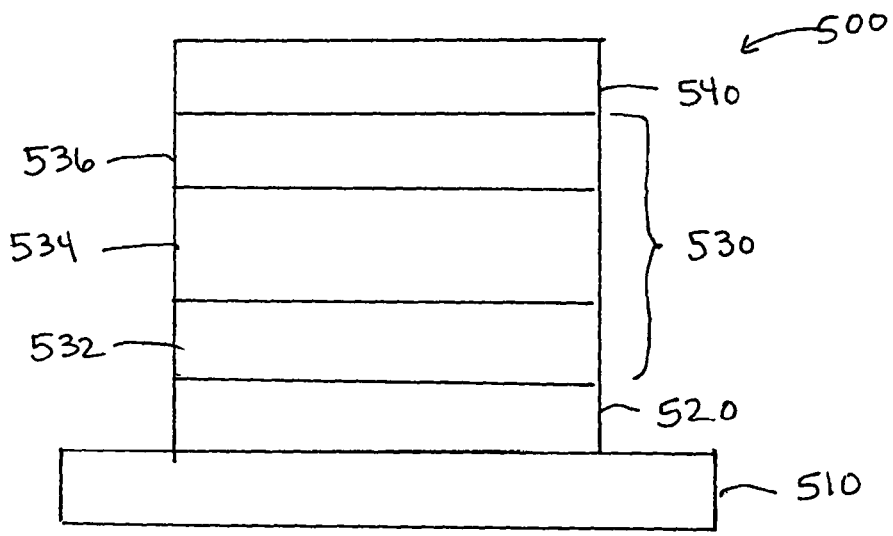
FIG. 5 is a schematic cross sectional view of a non-stacked OLED of Comparative Example I.

An individual OLED device was fabricated having a configuration as shown in FIG. 5. The substrate 510, anode 520, hole transport zone 532, mixed region 534, electron transport zone 536, and cathode 540 had the same composition and thickness of comparable layers in the device of Example I. When driven at a current density of around 31.25 mA/cm$^2$, the comparative device produced green emission at a brightness of 2600 cd/m$^2$. The comparative device had luminance values that translate to an electroluminescence efficiency of 8.3 cd/A. The driving voltage of the comparative device was 6.8 V. The color coordinates for the comparative example were (0.304, 0.621), which amounts to saturated green emission.

Operational Stability Testing

Figure 6:
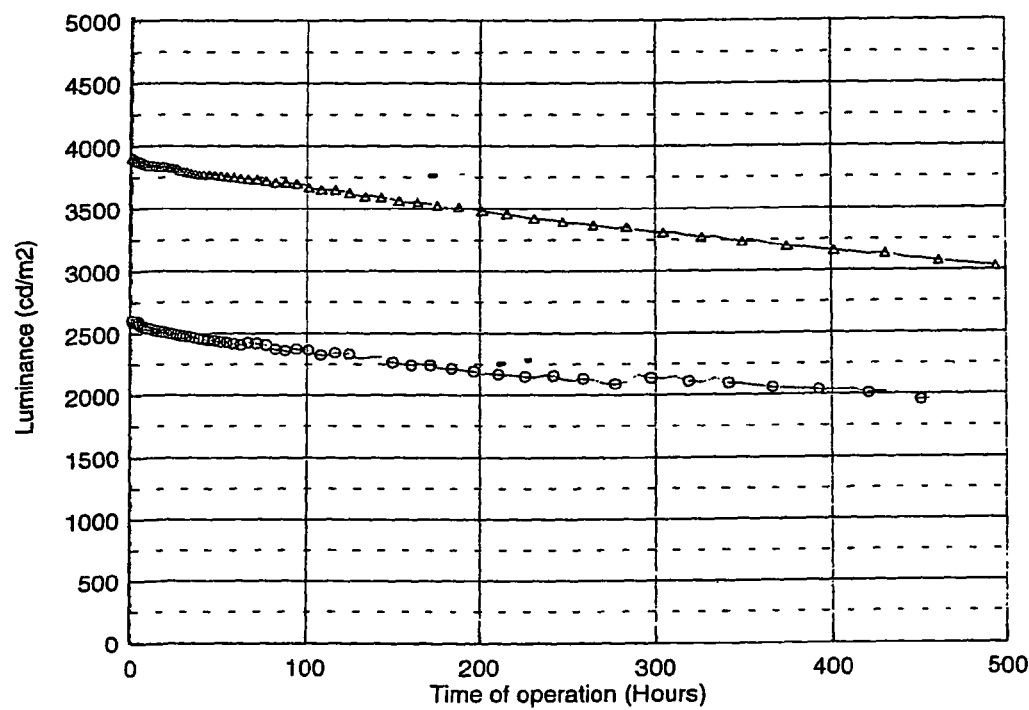
FIG. 6 is a graph comparing the operational stability of the standard device of Example I to the non-stacked device of Comparative Example I in terms of change in luminance in time.

Operational stability tests were carried out on the device of Example I and the device of Comparative Example I under AC driving conditions at an average forward constant current density of 31.25 mA/cm$^2$ in a dry atmosphere. The results are shown in FIG. 6 in the form of change in luminance in time under these conditions. As shown in FIG. 6, the stacked OLED of Example I demonstrates an operational stability comparable to that of the non-stacked OLED of Comparative Example I, with both demonstrating a decrease in luminance of only about 25% of the initial luminance after 500 hours of operation at 31.25 mA/cm$^2$. The stacked OLED, however, had a higher brightness than the non-stacked OLED. Thus, stacked OLED devices comprising OLEDs with a mixed region provide a device with high operational stability of non-stacked OLEDs comprising a mixed region but also provide high electroluminescence efficiency usually demonstrated by other stacked OLED devices.

While particular embodiments have been described, alternatives, modifications, variations, improvements, and substantial equivalents that are or may be presently unforeseen may arise to applicants or others skilled in the art. Accordingly, the appended claims as filed and as they may be amended are intended to embrace all such alternatives, modifications variations, improvements, and substantial equivalents.

The invention claimed is:

1. A stacked organic light emitting device comprising:
a first electrode;
a second electrode;
a plurality of luminescent regions disposed between the first and second electrodes; and
an intermediate electrode disposed between successive luminescent regions,
wherein at least one of the plurality of luminescent regions comprises a mixed region, the mixed region comprising a mixture of a first material, a second material, and a dopant, at least one of the first material, second material, and dopant being an emitter, and wherein an electron and hole transport capacities of the first material are different from an electron and hole transport capacities of the second material,
wherein said first and said second materials are bipolar transport materials,
wherein the intermediate electrode comprises a first surface contacting a hole transport zone of a first luminescent region and a second surface contacting an electron transport zone of a second luminescent region.

2. The stacked organic light emitting device according to claim 1, wherein each of the plurality of luminescent regions emits a different emission color.

3. The stacked organic light emitting device according to claim 1, wherein at least one of the plurality of luminescent regions emits an emission color different from an emission color emitted from at least one of the other luminescent regions.

4. The stacked organic light emitting device according to claim 1, wherein each of the plurality of luminescent regions emits the same emission color.

5. The stacked organic light emitting device according to claim 1, wherein at least a luminescent region comprising a mixed region further comprises a charge transport zone adjacent one of the first electrode, the second electrode, and the intermediate electrode.

6. The stacked organic light emitting device according to claim 1, wherein at least one of a luminescent region comprising a mixed region comprises the mixed region disposed between a first charge transport zone and a second charge transport zone.

7. The stacked organic light emitting device according to claim 1, wherein a mixed region comprises from about 5 to about 95 volume percent of the first material and from about 5 to about 95 volume percent of the second material.

8. The stacked organic light emitting device according to claim 7, wherein a mixed region further comprises a dopant in an amount of from about 0.01 to about 25 volume percent.

9. A display device comprising the stacked organic light emitting device of claim 1.

10. A stacked organic light emitting device comprising:
a first electrode;
a second electrode;
a plurality of luminescent regions disposed between the first and second electrodes and
an intermediate electrode disposed between successive luminescent regions,
wherein at least one of the plurality of luminescent regions comprises a first charge transport zone, a second charge transport zone, and a mixed region disposed between the first and second charge transport zones, the mixed region comprising a mixture of a first material, a second material, and a dopant, at least one of the first material, second material, and dopant being an emitter, and wherein an electron and hole transport capacities of the first material are different from an electron and hole transport capacities of the second material,
wherein said first and said second materials are bipolar transport materials,
wherein the intermediate electrode comprises a first surface contacting a hole transport zone of a first luminescent region and a second surface contacting an electron transport zone of a second luminescent region.

11. The stacked organic light emitting device according to claim 10, wherein each of the plurality of luminescent regions emits a different color.

12. The stacked organic light emitting device according to claim 10, wherein each of the plurality of luminescent regions emits the same emission color.

13. The stacked organic light emitting device according to claim 10, wherein an intermediate electrode comprises a first surface in contact with a charge transport zone of a first luminescent region, and a second surface in contact with a charge transport surface of a second luminescent region, each of the charge transport zones contacting the first and second surfaces of the intermediate electrode having the same charge transporting function.

14. The stacked organic light emitting device according to claim 10, wherein the intermediate electrode is a single layer capable of injecting a single type of charge into an adjacent charge transport zone.

15. The stacked organic light emitting device according to claim 10, wherein each of the plurality of light emitting regions comprises a first charge transport zone, a second charge transport zone, and a mixed region disposed between the first and second charge transport zones, the mixed region comprising a mixture of a first material, a second material, and a dopant, at least one of the first material, second material, and dopant being an emitter, and wherein the said first and second materials have different electron and hole transport capacities.

16. The stacked organic light emitting device according to claim 10, wherein the first electrode is an anode and the second electrode is a cathode.

17. The stacked organic light emitting device according to claim 10, wherein the first electrode is a cathode and the second electrode is an anode.

18. The stacked organic light emitting device according to claim 10, wherein each of the first and second electrodes is an anode.

19. The stacked organic light emitting device according to claim 10, wherein each of the first and second electrodes is a cathode.

20. The stacked organic light emitting device according to claim 10, wherein the intermediate electrode contacting a hole transport zone of a first luminescent region and an electron transport zone of a second luminescent region comprise a first layer adjacent the hole transport zone of the first luminescent region and a second layer adjacent the electron transport zone of the second luminescent region, the first layer comprising a hole injecting material, and the second layer comprising an electron injecting material.

21. The stacked organic light emitting device according to claim 10, wherein a mixed region comprises from about 5 to about 95 volume percent of the first material and from about 5 to about 95 volume percent of the second transport material.

22. The stacked organic light emitting device according to claim 21, wherein a mixed region further comprises a dopant in an amount in an amount from about 0.01 to about 25 volume percent.

23. A display device comprising the stacked organic light emitting device of claim 10.

24. A stacked organic light emitting device comprising:
a first electrode;
a second electrode;
a plurality of luminescent regions disposed between the first and second electrodes; and
an intermediate electrode disposed between successive luminescent regions,
wherein at least one of the plurality of luminescent regions comprises a mixed region, the mixed region comprising a mixture of a first material, a second material, and a dopant, at least one of the first material, second material, and dopant being an emitter, and wherein an electron and hole transport capacities of the first material are different from an electron and hole transport capacities of the second material; and,
wherein at least one of the one or more intermediate electrodes is a metal-organic mixed layer electrode comprising a first charge injecting layer, a second charge injecting layer, and a metal-organic mixed layer disposed between the first and second charge injecting layers,
wherein said first and said second materials are bipolar transport materials,
wherein the intermediate electrode comprises a first surface contacting a hole transport zone of a first luminescent region and a second surface contacting an electron transport zone of a second luminescent region.

25. The stacked organic light emitting device according to claim 24, wherein the metal-organic mixed layer of the metal-organic mixed layer electrode independently comprises a metal material in an amount of from about 5 to about 95 percent by volume and an organic material in an amount of from about 5 to about 95 percent by volume.

26. The stacked organic light emitting device according to claim 24, wherein the metal-organic mixed layer of the metal-organic mixed layer electrode comprises a metal material in an amount of from about 5 to about 30 percent by volume and an organic material in an amount of from about 95 to about 70 percent by volume.

27. The stacked organic light emitting device according to claim 1, wherein the hole transport capacity of the first material is at least two times higher than the hole transport capacity of the second material.

28. The stacked organic light emitting device according to claim 1, wherein the first and second materials are selected from 2-butyl-9,10-di-(2-naphthyl)anthracene, 9,10-di-(2-naphthyl)anthracene, 9, 10-di-phenyl anthracene, 9, 9-bis[4-(9-anthryl)phenyl] flourine and 9,9-bis[4-(10-phenyl-9-anthryl)phenyl] flourine.

* * * * *